United States Patent
Yarborough, Jr.

(10) Patent No.: US 6,392,455 B1
(45) Date of Patent: May 21, 2002

(54) BAUD RATE GENERATOR WITH FRACTIONAL DIVIDER

(75) Inventor: John M. Yarborough, Jr., Palo Alto, CA (US)

(73) Assignee: Koninklijke Philips Electronics N.V., New York, NY (US)

(*) Notice: Subject to any disclaimer, the term of this patent is extended or adjusted under 35 U.S.C. 154(b) by 0 days.

(21) Appl. No.: 09/881,003

(22) Filed: Jun. 14, 2001

Related U.S. Application Data

(60) Provisional application No. 60/280,410, filed on Mar. 30, 2001.

(51) Int. Cl.[7] .............................................. H03K 21/00

(52) U.S. Cl. ....................................... 327/115; 327/117

(58) Field of Search ................................. 327/115, 117, 327/113; 377/48, 49, 52

(56) References Cited

U.S. PATENT DOCUMENTS

| 4,638,498 | A | * | 1/1987 | Sinniger et al. .......... 123/406.6 |
| 5,361,290 | A | * | 11/1994 | Akiyama ..................... 327/115 |
| 5,754,067 | A | * | 5/1998 | Komatsu et al. ............. 327/115 |
| 6,072,534 | A | * | 6/2000 | Dell'ova et al. ............ 327/115 |

* cited by examiner

Primary Examiner—Toan Tran
Assistant Examiner—Linh Nguyen
(74) Attorney, Agent, or Firm—Harold Tsiang

(57) ABSTRACT

A programmable fractional frequency divider enables a finer resolution of output frequency than conventional integer frequency dividers. The programmable fractional frequency divider of this invention allows for the programmability of both an integer divisor as well as a fraction component. The average frequency of the output signal from the fractional divider is dependent upon both the integer divisor and the fraction component, thereby providing for a finer resolution to the average frequency of the output signal. This combination of integer and fractional frequency division is particularly well suited for the generation of signals for systems that are substantially jitter-insensitive.

14 Claims, 2 Drawing Sheets

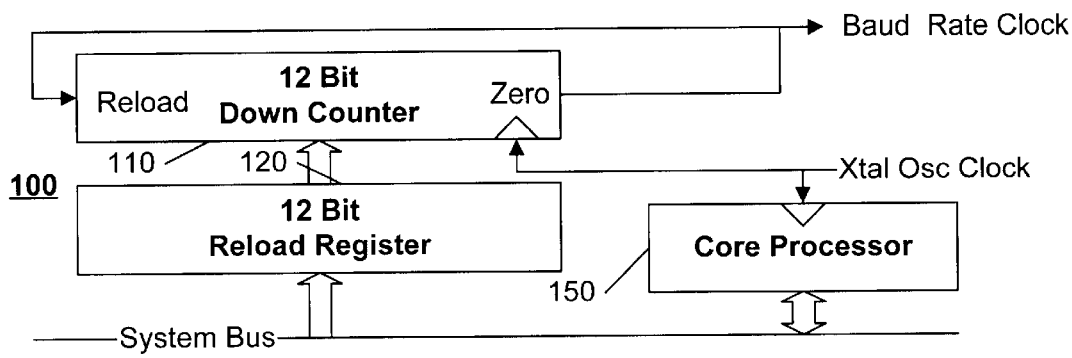
FIG. 1 [Prior Art]
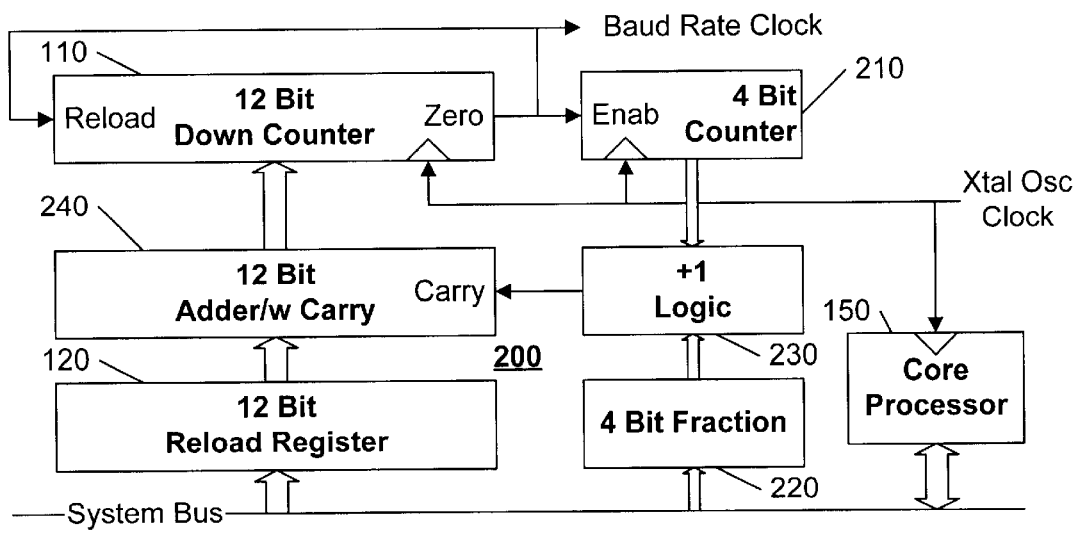
FIG. 2
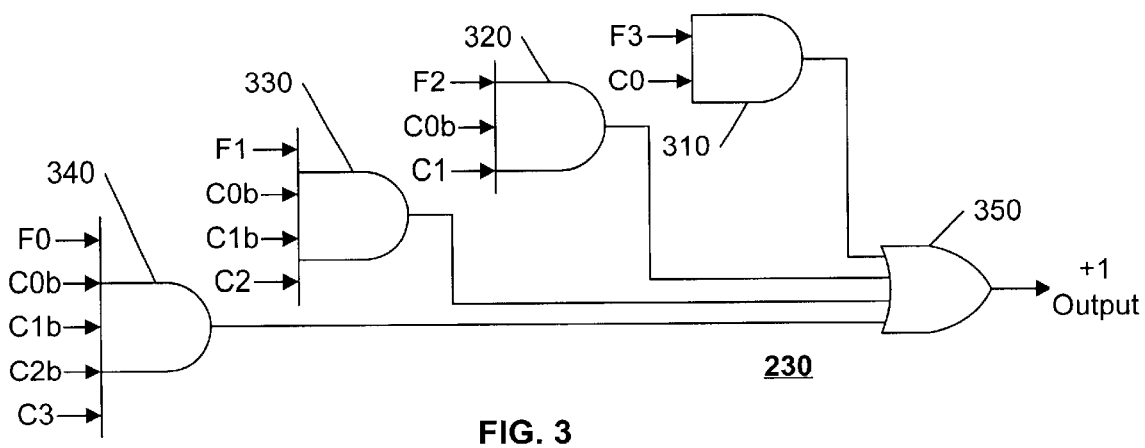
FIG. 3

BAUD RATE GENERATOR WITH FRACTIONAL DIVIDER

This application claims the benefit of U.S. Provisional Application No 60/280410, filed on Mar. 30, 2001.

BACKGROUND OF THE INVENTION

1. Field of the Invention

This invention relates to the field of electronic circuits, and in particular to a circuit for generating lower-speed baud rates, such as used for serial communications, from higher-speed oscillators, such as microprocessor clocks 2. Description of Related Art Digital systems typically include a clocking signal for providing periodic signals, and signals of known duration. That is, the clocking signal provides a time reference upon which other timed actions depend. Within the same system, multiple time references are often required. For example, in a microprocessor system, the microprocessor typically requires a high-speed clock that regulates the speed of the central processing unit (CPU), the speed and timing of memory accesses, and other high-speed events. Additionally, for communicating with external devices, such as modems or printers, the microprocessor requires a relatively low speed clock.

Because whole-cycle frequency dividers are relatively simple devices, compared to frequency generators, systems with multiple time references typically provide the multiple time references by dividing-down a high-speed clock. FIG. 1 illustrates a microprocessor system that includes a conventional frequency divider 100. The divider 100 is programmable to provide a lower speed clock signal, the "Baud Rate Clock", from a higher speed clock signal, the "Xtal Osc Clock" (Crystal Oscillator Clock). The high-speed clock signal is preferably the highest speed clock within a processing system, which is generally the same clock signal used by the core processor, or CPU, 150. The example divider 100 includes a re-loadable count-down counter 110, and a register 120 that provides the re-load value to the counter 110. In operation, the register 120 is loaded with a value corresponding to a ratio of the high-speed clock frequency to the desired low-speed clock frequency, discussed further below, and thereafter the low-speed clock is automatically generated at the desired frequency, without further intervention by the core processor 150.

The count-down counter 110 is clocked by the higher speed clock signal, and generates an output signal each time the count-down counter 110 reaches zero. The output signal is also coupled to the reload input of the counter 110, and causes the counter 110 to be reloaded with the contents of the register 120 at the next clock cycle of the higher speed clock signal. Thus, if the register 120 contains a value of N, the zero signal will be asserted at each N+1th cycle of the higher speed clock (one cycle to load the value of N, plus N cycles to reduce the count to zero), thereby providing a "divide-by-N+1" frequency divider that can be programmed for a particular division by loading the proper value of N into the register 120. Illustrated in FIG. 1 is a 12-bit register 120 and 12-bit counter 110, thereby allowing the frequency divider 100 to provide a division of the high-speed clock by any integer multiple between 2 and 8192.

Note that unless the high-speed clock is approximately an integer multiple of the low-speed clock, the frequency divider 100 will not be able to provide an accurate low-speed clock frequency. Note also that the higher the ratio of the high-speed to low-speed clock frequencies, the finer the available resolution. Consider, for example, a 100 MHz high-speed clock, and a desired low-speed clock frequency of 18 KHz. A ratio of 5555 provides a low-speed clock of 18,001.8 Hz, and a ratio of 5556 provides a low-speed clock of 17,998.5 Hz. In this example, 5556 would be selected, and the low-speed clock will be within 1.5 Hertz of the desired 18 KHz (less than 0.01% error). Consider, however, a high-speed clock of 100 KHz, and the same desired low-speed clock frequency. A ratio of 5 provides a low-speed clock of 20,000.0 Hz, and a ratio of 6 provides a low-speed clock of 16,666.7 Hz. In this example, the best option (a ratio of 6) will produce an error of over 1,333 Hz. (over 7% error), and would likely be unacceptable. Generally, for acceptable frequency accuracy, a minimum ratio of 50:1 is required for supporting independent high-speed and low-speed clock frequencies. That is, the high-speed clock frequency is typically selected by the designer of the core processor 150, or other components within the microprocessor system, and the low-speed clock frequency is typically determined based on existing communications standards, or based on characteristics of a device that is external to the microprocessor system. As such, the high-speed clock frequency and low-speed clock frequency are generally substantially independent of each other, and an integer-factor relationship between the high-speed and low-speed clocks cannot be assumed. To allow for the programming of an arbitrary low-speed clock frequency, a ratio of 50:1 between the high and low clock frequencies is generally considered a minimum requirement.

This minimum ratio of 50:1 for the general-purpose application of a programmable frequency divider had not been a significant constraint in typical microprocessor designs, because the master CPU clock has conventionally been substantially faster than the clocks required for serial communications, or other derived-clock applications. The increased need for low-power processors (lower processor clock speed), and the increased need for faster communications (higher interfacing clock speeds), however, has substantially narrowed the gap between CPU clock speeds and derived-clock speeds.

BRIEF SUMMARY OF THE INVENTION

It is an object of this invention to provide a frequency divider that can provide accurate low-speed clock frequencies with a minimal difference between the low-speed clock frequency and the clock frequency that provides the input to the frequency divider. It is a further object of this invention to provide a programmable frequency divider that has a resolution that is substantially less dependent upon the difference between the high and low clock frequencies than conventional frequency dividers.

These objects and others are achieved by providing a programmable fractional frequency divider that is configured to enable a finer resolution of output frequency than conventional frequency dividers. The programmable fractional frequency divider of this invention allows for the programmability of both an integer divisor as well as a fraction component. The average frequency of the output signal from the fractional divider is dependent upon both the integer divisor and the fraction component, thereby providing for a finer resolution to the average frequency of the output signal. This combination of integer and fractional frequency division is particularly well suited for the generation of signals for systems that are substantially jitter-insensitive.

BRIEF DESCRIPTION OF THE DRAWINGS

The invention is explained in further detail, and by way of example, with reference to the accompanying drawings wherein:

FIG. 1 illustrates an example microprocessor system with a conventional programmable frequency divider.

FIG. 2 illustrates a microprocessor system with an example programmable fractional frequency divider in accordance with this invention.

FIG. 3 illustrates an example logic structure for adjusting an output period of a fractional frequency divider in accordance with this invention.

Throughout the drawings, the same reference numerals indicate similar or corresponding features or functions.

DETAILED DESCRIPTION OF THE INVENTION

Figure 4:
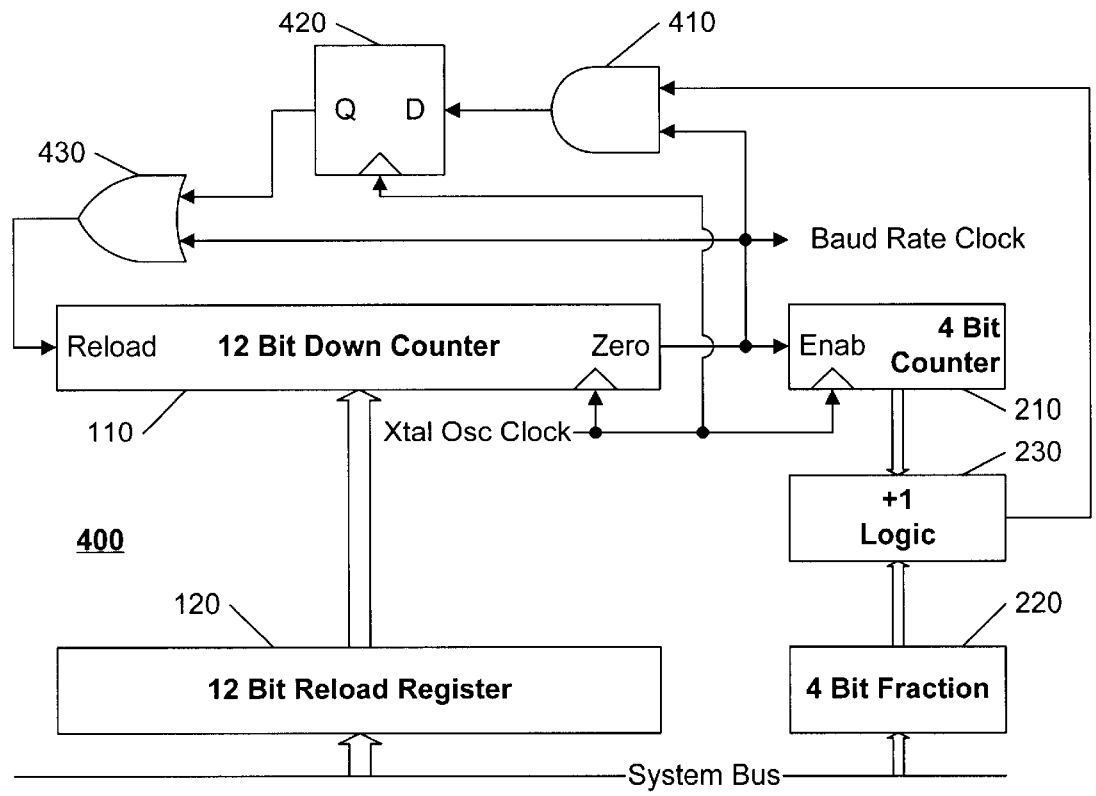
FIG. 4 illustrates an alternative example programmable fractional frequency divider in accordance with this invention.

This invention is based on the observation that a number of derived-clock systems, and in particular, derived serial-port-clocks on conventional microcontrollers and microprocessors, are designed for use in jitter-insensitive applications. As noted above, conventional asynchronous serial communications systems, such as Universal Asynchronous Receiver-Transmitter (UART) systems, are designed to allow for noisy communication paths that may introduce substantial intermediate frequency changes or anomalies. For example, attenuation in the communications path may "round-off" transition edges of transmitted signals, thereby causing a delayed detection of one or more of each of the edges of the transmitted signals. At a receiving system, this rounding of the edges may produce a foreshortened, or elongated, pulse when the round-off edge triggers, or fails-to-trigger, a threshold detector in the receiver that is configured to identify each state transition of the input signal. Each affected transition corresponds to an effective change in the period, or pulse width, of the received signal, as interpreted by the receiver. Depending upon the degree of attenuation at any point in time, different pulses of the received signal will exhibit different received pulse widths, and conventional receiving systems are designed to accommodate these varying pulse widths. On the other hand, because asynchronous communication systems do not, by definition, have a reference clock that is common to the transmitter and receiver, such systems rely upon the transmitter and receiver having substantially the same pulse frequency. That is, conventional asynchronous communications systems assume a common pulse rate, but allow for substantially varying pulse durations. Alternatively viewed, conventional asynchronous communications systems assume a common average frequency, but allow for substantial jitter about this common average. This invention is particularly well suited for systems that require an accurate average frequency, but allow for jitter about this average.

FIG. 2 illustrates a microprocessor system with an example programmable fractional frequency divider 200 in accordance with this invention. The programmable fractional frequency divider 200 includes the counter 110 and register 120 of the prior art divider 100 of FIG. 1, but also includes an adder 240 that is configured to selectively vary the value that is loaded into the counter 110, depending upon the state of a Carry input signal to the adder 240. If the carry input signal is asserted, the value provided to the countdown counter 110 is one more than the value that is currently in the register 120. That is, if the value in the register 120 is N, the Baud Rate Clock output signal from the counter 110 will occur after N+1 cycles of the Xtal Osc Clock input signal (as discussed above with regard to FIG. 1) when the Carry input signal to the adder 240 is zero, and will occur after N+2 cycles of the Xtal Osc Clock when the Carry input signal to the adder 240 is one. In this manner, the output signal from the counter 110 is either a "divide-by-N+1" or a "divide-by-N+2" of the input clock signal.

Consider, for example, an assertion of the Carry input signal to the adder 240 every other time that the output Baud Rate clock is asserted. When the Carry input is zero, the clock input is divided by N+1; when the Carry input is one, the clock is divided by N+2. This corresponds to an average division of the clock input signal by a factor of N+1+0.5. If the Carry input signal is asserted every fourth cycle of the output clock, the average division is by a factor of N+1+0.25; if the Carry input signal is asserted every eighth cycle, the average division is by a factor of N+1+0.125; and so on. Note that the assertion of the Carry input signal stretches the pulse duration, relative to the duration when the Carry input signal is not asserted. Relative to the average pulse frequency, the assertion of the Carry input signal introduces a slower intermediate pulse frequency, and the non-assertion of the Carry input signal introduces a faster intermediate pulse frequency. That is, the Carry input signal introduces a positive or negative jitter about the average pulse frequency.

The sizes of the registers 120, 220 and counters 110, 210 (twelve bits for the integer division and four bits for the fractional division) are illustrated as typical sizes, although it would be evident to one of ordinary skill in the art that the principles of this invention are applicable regardless of the particular sizes of the registers and counters.

Any of a variety of techniques can be employed to determine when to assert the Carry input signal to provide an average output frequency that differs from an integer division of the input clock frequency. Illustrated in FIG. 2 are a counter 210, a fraction register 220, and a "+1" logic block 230 that determines whether the Carry input to the adder 240 is asserted. In this example embodiment, the register 220 is a four-bit register that contains a value, F, between 0 and 15, and the +1 logic block 230 is configured to assert the Carry input signal every F/16 cycles of the output Baud Rate Clock. In this manner, the resolution that is achievable in the average output frequency of the divider 200 is 1/16 as fine as the resolution that is achievable by the prior art divider 100 of FIG. 1. Thus, if a minimum ratio of high to low clock frequencies is 50:1 for the general purpose application of the programmable divider 100, the programmable divider 200 in accordance with this invention requires a mere 3:1 (50/16:1) ratio to achieve the same resolution in average output frequency.

In the example of FIG. 1, wherein the high-frequency clock is 100 KHz and the low-frequency clock is 18 KHz, the register 120 is loaded with a value of four, and the fraction register 220 is loaded with a value of nine, thereby providing an effective division by 4+1+9/16, for an average output frequency of 17,977.5 Hz (100 KHz/5.5625), which is within 23 Hz (0.13%) of the desired low-frequency clock output frequency, as compared to an error of 1333 Hz (7.4%). In operation, the counter 110 provides an output every six cycles of the input clock for 9 out of 16 of the output cycles, and every five cycles of the input clock for the remaining 7 out of 16 output cycles. Preferably, the +1 logic 230 is configured so that the six-cycle and five-cycle periods occur as uniformly as possible within each 16 output cycles, to prevent long periods of one frequency (100 KHz/5) followed by long periods at another frequency (100 KHz/6).

FIG. 3 illustrates an example logic structure for adjusting an output period of a fractional frequency divider 200 in accordance with this invention, to uniformly distribute the different frequency periods as much as possible. F3–F0 represent the contents of the fraction register 220, and C3–C0 represent the contents of the counter 210, from most-significant bit to least-significant bit. A "b" suffix ("bar") indicates a complement of the indicated signal.

Consider a fraction value of "1000" (F3=1, F2–F0=0), which indicates that eight of sixteen output cycles are "divide-by-N+1" and the remaining eight are "divide-by-N+2", for an average dividing ratio of N+1.5. Gate 310 is an AND of F3 (logic-1) and the least significant bit of the counter 210 (logic-1 at every other cycle). Each of the other AND gates 320, 330, 340 have a logic-0 output, because F2–F0 are at a logic-0. The "+1 output" of the gate 350, therefore, is assert at logic-1 at every other cycle of the counter 210, thereby providing alternating divide-by-N+1 and divide-by-N+2 cycles, rather than a series of divide-by-N+1 cycles followed by a series of divide-by-N+2 cycles. In like manner, if bit F2 is set to a logic-1, the "+1 output" of the gate 350 is asserted each time the least significant bits C1–C0 of the counter 210 are "10", via the gate 320, thereby providing a logic-1 output every four out of sixteen counts of the counter 210. If both bits F2 and F3 are set, and F1 and F0 are clear ("1100"), the divide-by-N+1 occurs at every odd cycle, and at every fourth cycle, for a total of twelve cycles (8+4) out of sixteen. In like manner, gates 330 and 340 enable the assertion of the "+1 output" every eighth cycle and every sixteenth cycle, respectively.

Other logic structures for selectively causing a longer-duration period between output pulses will be evident to one of ordinary skill in the art in view of this disclosure.

FIG. 4 illustrates an alternative example programmable fractional frequency divider 400 in accordance with this invention. This alternative example comprises logic gates 410, 420, and 430 that replace the function of the adder 240 in FIG. 2. The same "+1 logic" block 230 asserts an output signal whenever a longer-duration period between output pulses is required to achieved the desired average output frequency. In this alternative embodiment, however, when the "+1 output" is asserted, a logic-1 is provided to the input of the delay flip-flop 420, via the AND gate 410. The output of the delay flip-flop 420 corresponding to this asserted "+1 output" is provided one cycle later to the OR gate 430. This causes the counter 110 to be "re-loaded" twice in succession, once when the output Baud Rate Clock is asserted, and immediately again when the delayed output from the flip-flop 420 is asserted. Because each re-load consumes one clock cycle, the successive reload introduces an additional clock cycle to the down-count cycle of the counter 110, thereby providing the selective longer-duration period between output pulses.

Figure 5:
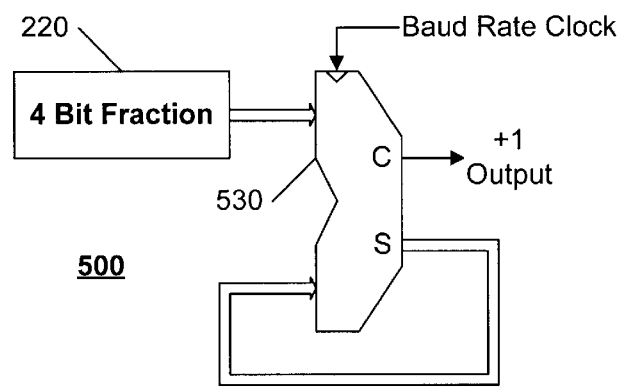
FIG. 5 illustrates an alternative example logic structure for adjusting an output period of a fractional frequency divider in accordance with this invention.

FIG. 5 illustrates an alternative example logic structure 500 for adjusting an output period of a fractional frequency divider in accordance with this invention. The accumulator 530 with cyclic feedback replaces the counter 210 and "+1 logic" 230 of FIGS. 2 and 4. In this embodiment, the value of the fraction register 220 is repeatedly accumulated at each cycle of the output Baud Rate Clock. Each time the accumulator 530 overflows, and generates a carry output, a longer-duration period between output pulses is provided, corresponding to the "+1 output" signal's function detailed above. The accumulator 530 is of the same width as the fraction register 220, so that the overflow occurs with every accumulation that exceeds the maximum value of the register 220. If, for example, the fraction register 220 contains a value of "1000", an overflow will occur at every half cycle. If, on the other hand, the fraction register 220 contains a value of "0001", an overflow will only occur at every sixteenth cycle; if the fraction register 220 contains a value of "1010", an overflow will occur at every ten out of sixteen cycles. Using the convention of "(C) Sum" to indicate the output of the accumulator 530 with an input of 1010 from the register 220, the output sequence will be: {(0)1010, (1)0100, (0)1110, (1)1000, (1)0010, (0)1100, (1)0110, (1)0000, (0) 1010, (1)0100, (0)1110, (1)1000, (1)0010, (0)1100, (1)0110, (1)0000}, for a total of ten carry (1) assertions, and six carry (0) assertions, that are fairly uniformly distributed.

The foregoing merely illustrates the principles of the invention. It will thus be appreciated that those skilled in the art will be able to devise various arrangements which, although not explicitly described or shown herein, embody the principles of the invention and are thus within the spirit and scope of the following claims.

I claim:

1. A programmable frequency divider comprising:
   a first counter that is configured to receive an input clock signal at a first frequency and to produce an output pulse after a select number of input clock signal cycles,
   a first register that is configured to contain an integer divisor,
   a second register that is configured to contain a fraction component, and
   a control device that is configured to provide the select number to the first counter, based on the integer divisor and the fraction component.

2. The programmable frequency divider of claim 1, wherein
   the control device includes:
      an adder that is configured to selectively increment the integer divisor to provide the select number based on a carry-input signal, and
      a logic device that is configured to provide the carry-input signal, based on the fraction component and a sequence of prior output pulses.

3. The programmable frequency divider of claim 2, wherein
   the logic device includes:
      a second counter that is configured to maintain a count of the output pulses, and
      logic gates that are configured to provide the carry-input signal at select counts of the output pulses, based on the fraction component.

4. The programmable frequency divider of claim 2, wherein
   the logic device includes:
      an accumulator that:
         accumulates a sum of the fraction component with each prior output pulse and
         generates the carry-input signal each time the sum exceeds a logical size of the accumulator.

5. The programmable frequency divider of claim 1, wherein
   the control device includes:
      a delay device that is configured to cause the first divider to selectively repeat a cycle of the input clock signal cycles, based on the fraction component, thereby selectively incrementing the select number relative to the first divisor.

6. The programmable frequency divider of claim 5, wherein the logic device includes:
  a second counter that is configured to maintain a count of the output pulses, and
  logic gates that are configured to assert a select input value to the delay device at select counts of the output pulses, based on the fraction component.

7. The programmable frequency divider of claim 5, wherein
the logic device includes:
  an accumulator that:
    accumulates a sum of the fraction component with each prior output pulse and
    asserts a select input value to the delay device each time the sum exceeds a logical size of the accumulator.

8. A microprocessor system comprising:
a processor that is configured to receive an input clock signal at a first frequency, and
a programmable frequency divider that is configured to provide an output clock signal at a second frequency,
wherein
the programmable frequency divider includes:
  a first counter that is configured to receive the input clock signal at the first frequency and to cause a transition of the output clock signal after a select number of input clock signal cycles,
  a first register that is configured to contain an integer divisor,
  a second register that is configured to contain a fraction component, and
  a control device that is configured to provide the select number to the first counter, based on the integer divisor and the fraction component.

9. The microprocessor system of claim 8, wherein
the control device includes:
  an adder that is configured to selectively increment the integer divisor to provide the select number based on a carry-input signal, and
  a logic device that is configured to provide the carry-input signal, based on the fraction component and a sequence of prior output transitions.

10. The microprocessor system of claim 9, wherein
the logic device includes:
  a second counter that is configured to maintain a count of the prior output transitions, and
  logic gates that are configured to provide the carry-input signal at select counts of the prior output transitions, based on the fraction component.

11. The microprocessor system of claim 9, wherein
the logic device includes:
  an accumulator that:
    accumulates a sum of the fraction component corresponding to the prior output transitions and
    generates the carry-input signal each time the sum exceeds a logical size of the accumulator.

12. The microprocessor system of claim 8, wherein
the control device includes:
  a delay device that is configured to cause the first divider to selectively repeat a cycle of the input clock signal cycles, based on the fraction component, thereby selectively incrementing the select number relative to the first divisor.

13. The microprocessor system of claim 12, wherein
the logic device includes:
  a second counter that is configured to maintain a count corresponding to prior output transitions, and
  logic gates that are configured to assert a select input value to the delay device at select counts of the output transitions, based on the fraction component.

14. The microprocessor system of claim 12, wherein
the logic device includes:
  an accumulator that:
    accumulates a sum of the fraction component corresponding to the prior output transitions and
    asserts a select input value to the delay device each time the sum exceeds a logical size of the accumulator.

* * * * *